United States Patent [19]
Bruton

[11] 3,962,027
[45] June 8, 1976

[54] $Bi_4Ti_3O_{12}$ SINGLE CRYSTAL GROWTH FROM SATURATED SEEDED SOLUTION

[75] Inventor: Timothy Michael Bruton, Haywards Heath, England

[73] Assignee: U.S. Philips Corporation, Briarcliff Manor, N.Y.

[22] Filed: Sept. 9, 1974

[21] Appl. No.: 504,311

[30] Foreign Application Priority Data
Sept. 11, 1973 United Kingdom............... 42629/73

[52] U.S. Cl.............................. 156/624; 423/598; 23/305 R; 156/607
[51] Int. Cl.²..................... B01J 17/04; B01J 17/20; C01G 29/00
[58] Field of Search....... 423/598; 23/301 R, 305 R, 23/273 SP; 156/607, 617, 624, 616

[56] References Cited
UNITED STATES PATENTS
3,677,718  7/1972  Lawless............... 156/624

FOREIGN PATENTS OR APPLICATIONS
679,071  1/1964  Canada............... 23/305 R
989,907  1965  United Kingdom............... 23/305
173,421  8/1965  U.S.S.R............... 423/598

OTHER PUBLICATIONS
Kobayoshi, Growing of Ferroelectric $PbTiO_3$ Crystals, pp. 866 to 867, Journal of App. Phy., vol. 29, No. 5, May 1958.

Brice et al., The Czochralski Growth of $Bi_{12}SiO_{20}$ Crystals, Jour. of Crystal Growth, 24/25, 1974, pp. 429–431.

Chemical Abstracts, vol. 79, 1973, No. 14, p. 592, 86891g $Bi_4Ti_3O_{12}$, Gralosso, Dio Synth., 1973, No. 14, 144–145.

Primary Examiner—Stephen J. Emery
Attorney, Agent, or Firm—Frank R. Trifari; Norman N. Spain

[57] ABSTRACT

Method of growing single crystal of $Bi_4Ti_3O_{12}$ by a top-seeded growth technique. A solution of $TiO_2$ is a solvent consisting of $Bi_2O_3$ with/without $B_2O_3$ is prepared. The temperature of the solution is adjusted to a value which is not more than 5°C above the saturation temperature of the solution, and is maintained at this value while the degree of saturation of the solution is increased by dissolving $TiO_2$. A $Bi_4Ti_3O_{12}$ seed crystal is then lowered into the solution which is gradually cooled so as to grow a single crystal. The transparency of crystals grown from a solution containing $B_2O_3$ in addition to $Bi_2O_3$ is better than that of crystals grown from solutions in which the solvent consists solely of $Bi_2O_3$.

6 Claims, 5 Drawing Figures

$Bi_4Ti_3O_{12}$ SINGLE CRYSTAL GROWTH FROM SATURATED SEEDED SOLUTION

The invention relates to a method of growing a single crystal of bismuth titanate ($Bi_4Ti_3O_{12}$), to a single cyrstal of $Bi_4Ti_3O_{12}$ grown by such a method, and to an optical memory store element including such a single crystal.

Single crystals of $Bi_4Ti_3O_{12}$ have hitherto been grown by spontaneous nucleation by heating a solution of $TiO_2$ in $Bi_2O_3$ containing at least 10 mole % $TiO_2$ in a sealed platinum crucible at 1300°C. However, this method is slow and does not produce crystals of useful size reproducibly, the crystals typically being 100 $\mu$m thick, which is too thin for device fabrication.

The present invention provides a method of growing a single crystal of $Bi_4Ti_3O_{12}$, comprising the steps of preparing a solution of $TiO_2$ in a solvent consisting of $Bi_2O_3$ with/without $B_2O_3$, adjusting the temperature of the solution to a value which is not more than 5°C above the saturation temperature of the solution, maintaining the solution at the adjusted temperature while increasing the degree of saturation of the solution by immersing polycrystalline $TiO_2$ in the solution, removing the undissolved polycrystalline $TiO_2$ from the solution, then lowering a $Bi_4Ti_3O_{12}$ seed crystal into the solution at the said adjusted temperature and subsequently slowly cooling the solution. Preferably the solution consists of a solution of $TiO_2$ in $Bi_2O_3$ containing from 12 to 17 mole % $TiO_2$.

When the solvent consists of $Bi_2O_3$, and $B_2O_3$, it was found that crystals could be grown using a lower temperature and that the transparency of the resultant crystals was better than the transparency of crystals grown from a solution in which the solvent consisted solely of $Bi_2O_3$. Preferably a solution is used which consists of 12 mole % $TiO_2$, from 78 to 44 mole % $Bi_2O_3$ and from 10 to 44 mole % $B_2 O_3$. The seed crystal may be lowered into the solution when the solution is saturated or undersaturated. The crystal may be grown in an atmosphere which consists of air enriched with up to 0.5 atmosphere of oxygen.

Crystals have been reproducibly grown by the method according to the invention which were 15 × 10 × 1mm and of good quality. The time required per run was 5 days as compared with 20 days when using the above-mentioned spontaneous nucleation method.

Two embodiments of the invention will now be described with reference to the accompanying diagrammatic drawings, in which.

EXAMPLE 1

Figure 1:
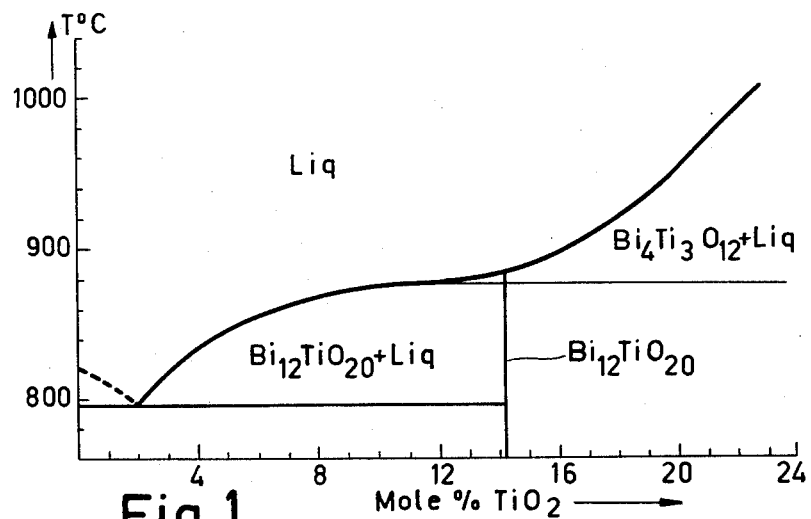
FIG. 1 is part of the phase diagram of the system $Bi_2O_3$—$TiO_2$.
Figure 5:
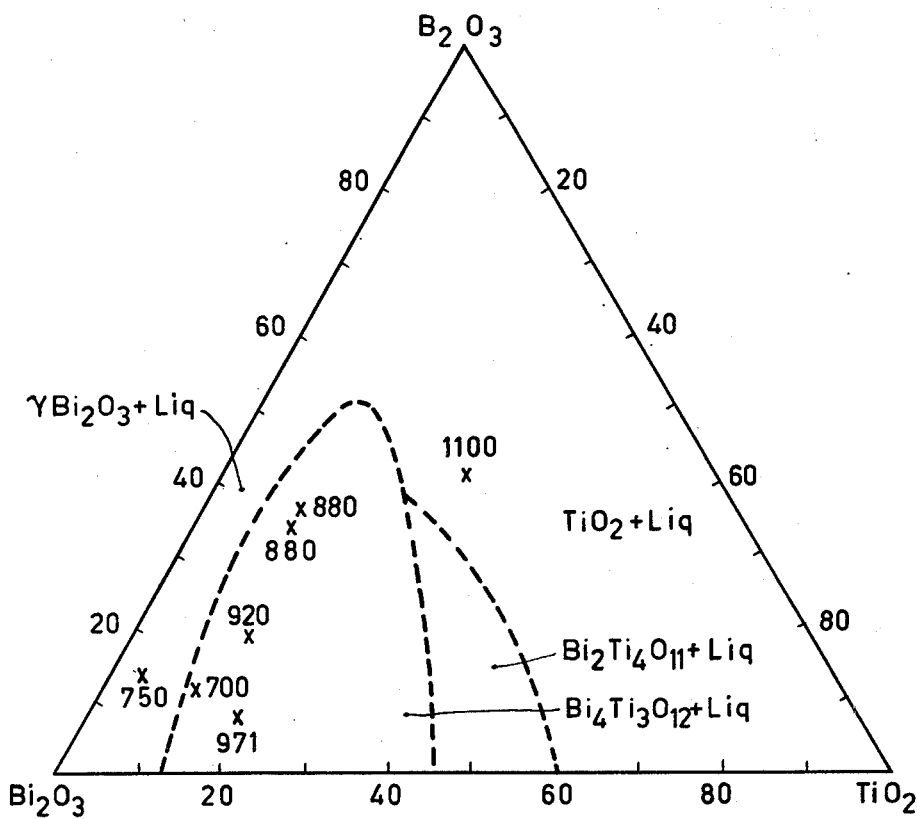
FIG. 5 is the phase diagram of the ternary system $B_2O_3$—$Bi_2O_3$—$TiO_2$.
Figure 2:
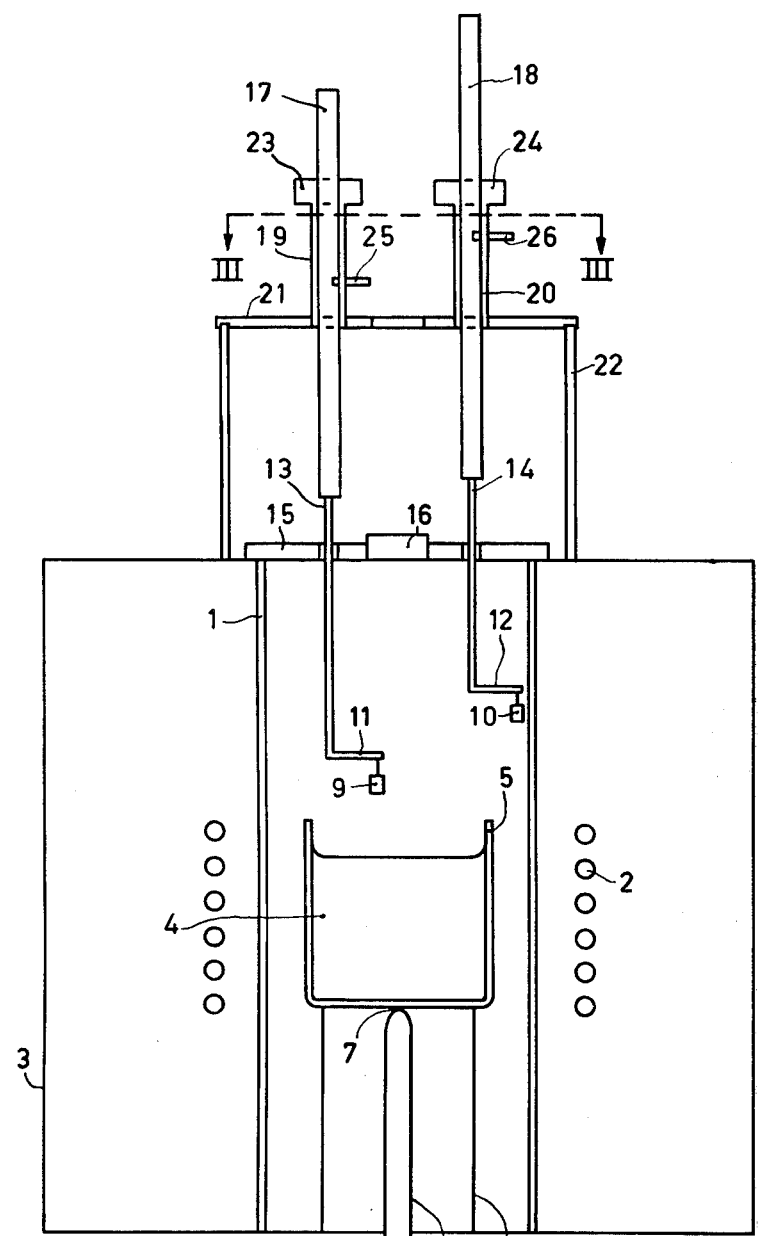
FIG. 2 is a sectional elevation of an apparatus for performing the invention.
Figure 3:
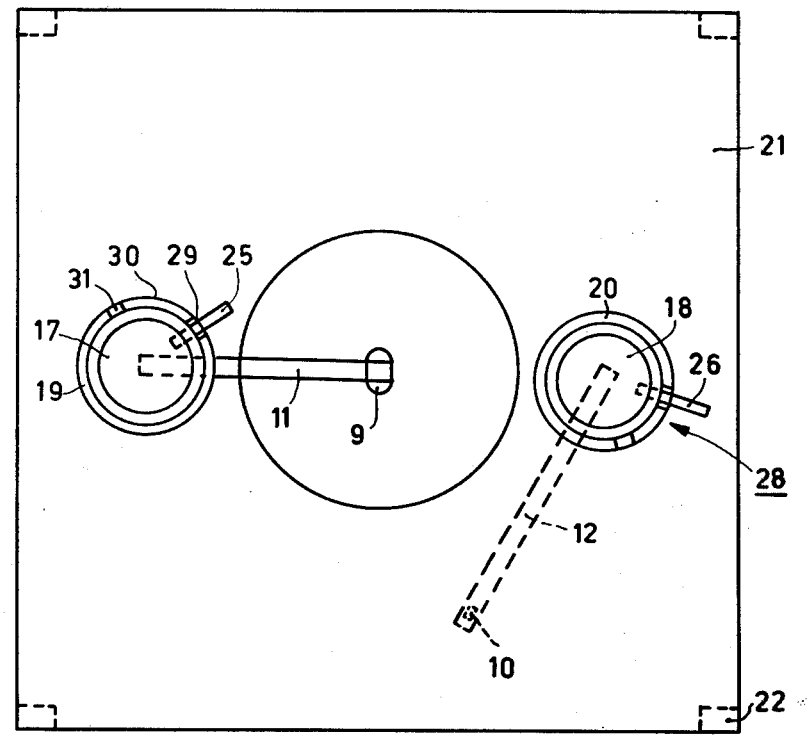
FIG. 3 is part of a cross-section of the FIG. 2 apparatus taken on the line III—III in FIG. 2, showing the disposition of a seed holder and of a polycrystalline $TiO_2$ source with respect to a supporting structure.

Single crystals of $Bi_4Ti_3O_{12}$ were grown using the apparatus shown in FIGS. 2 and 3. A furnace was used which consisted of a vertically disposed alumina tube 1 heated by silicon carbide heating elements 2 and contained in a furnace enclosure 3. A solution 4 from which the crystal was grown was contained in a cylindrical platinum crucible 5, 35 mm in diameter and 35 mm high, supported on a pedestal 6. A thermocouple 7 was welded to the bottom of the crucible 5, the leads 8 of the thermocouple extending through the bore of the pedestal 6 and out of the furnace enclosure 3.

Figure 4:
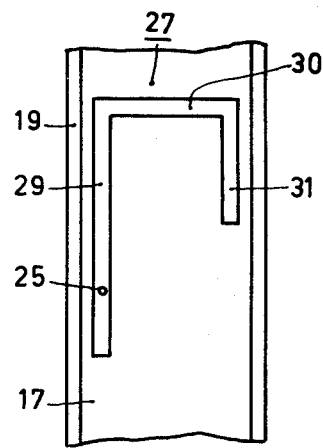
FIG. 4 is an elevation of a sleeve which is part of the apparatus shown in FIGS. 2 and 3.

A polycrystalline source 9 and a $Bi_4Ti_3O_{12}$ seed crystal 10 were suspended by means of 0.5 mm diameter platinum wire from 20 mm long cross-pieces 11, 12 carried by 4 mm diameter ceramic rods 13, 14 respectively, which extend through apertures in a ceramic cover plate 15 supported on the upper end of the alumina tube 1. A silica window 16 was provided in the central area of the cover plate 15 so as to make it possible to observe the solution 4 during the process. The ceramic rods 13, 14 were connected to threaded steel rods (the threads of which are not shown) 17, 18 which extended through brass sleeves 19, 20 respectively carried by an aluminium platform 21 supported by four aluminium legs 22 which rested on the furnace enclosure 3. The vertical positions of the polycrystalline source 9 and 10 with respect to the solution 4 were adjusted with the aid of nuts 23, 24 which engaged respectively with the threaded rods 17, 18. The threaded rods 17, 18 were each provided with radially-extending locating pins 25, 26 respectively which engaged in slots 27, 28 in the sleeves 19, 20, these slots enabling the polycrystalline source 9 and seed 10 to be located in the desired positions. FIG. 4 shows the slot 27 in the sleeve 19, the pins 25 being in a slot-portion 29 when the polycrystalline source 9 was in the position shown in FIG. 3 by unbroken lines. The polycrystalline source 9 was moved to the position in FIG. 3 indicated by broken lines by raising the rod 17 so that the pin 25 was at the top of the slot-portion 29, turning the rod 17 so that the pin 25 traversed the slot-portion 30 and then lowering the rod 17 so that the pin 25 was located in the slot-portion 31. The slot 28 was similar to the slot 27, enabling the seed to be similarly located.

150 g of a mixture of grade I $Bi_2O_3$ and $TiO_2$ containing 17 mole % was prepared, the materials being mixed and loaded into the platinum crucible 5. The mixture was sintered in the crucible by heating in air in a muffle furnace at 950°C so as to compact the mass. The crucible 5 was then placed in the apparatus shown in FIGS. 2 to 4 and was heated for 24 hours at a temperature 10°C above the liquidus temperature (which is 930°C for a 17 mole % $TiO_2$ solution) in order to prepare a homogeneous solution. The atmosphere in the apparatus during the whole crystal growing process was air. The solution 4 was then cooled to 5°C above the liquidus temperature, and the polycrystalline $TiO_2$ source 9 which consisted of a rod weighing 2 g. was lowered into the solution 4 and was left immersed in the solution 4 for 1 hour. The solution 4 was left in a saturated or slightly unsaturated condition as a result of the immersion of the polycrystalline source 9. A $Bi_4Ti_3O_{12}$ seed crystal 10 which weighed 80 mg was then lowered into the solution 4 and the crucible 5 was allowed to cool at 0.5°C per hour. The seed crystal 10 was a plate with an (001) face located parallel to the surface of the solution 4. Cooling was continued at this rate for 40 hours, and then the grown crystal was withdrawn for the solution 4, the crucible temperature was lowered to 800°C at 50°C per hour, and then the power supply to the heating elements 2 was switched off. The grown crystal was allowed to cool to room temperature inside the tube 1, and any adhering solidified solution was removed by immersing the crystal in 18 % by weight HCl at 80°C for 6 hours.

It was found that $Bi_4Ti_3O_{12}$ crystals which were 10 × 10 × 1 mm could be grown reproducibly by this method. The same melt may be used again, although the liquidus temperature falls after each run as the titanium content of the solution falls.

EXAMPLE 2

Single crystals of $Bi_4Ti_3O_{12}$ were grown from a solution of $TiO_2$ in a mixture of $B_2O_3$ and $Bi_2O_3$. A platinum crucible which was 50 mm in diameter and 50 mm high was used in the apparatus described in Example 1 with reference to FIGS. 2 and 3 of the accompanying drawings. A mixture of 172 g $Bi_2O_3$, 31 g $H_3BO_3$ and 7 g $TiO_2$ (all grade I chemicals supplied by Johnson Matthey Chemicals Ltd.) was placed in the platinum crucible, the charged crucible being heated in air at 950°C in a muffle furnace so as to compact the mass. The crucible was then transferred to the apparatus shown in FIGS. 2 to 4, and was heated for 16 hours at a temperature 10°C above the liquidus temperature. The solution 4 was then cooled to 5°C above the liquidus temperature. The immersion of the polycrystalline $TiO_2$ source 9, crystal growth, cooling and washing of the grown crystal were carried out as described in Example 1.

Crystals of a similar size but of better transparency are produced than when using $Bi_2O_3$—$TiO_2$ without $B_2O_3$, and are more fully facetted.

What is claimed is:

1. A method of growing a single crystal of $Bi_4Ti_3O_{12}$, said method comprising, preparing a solution of $TiO_2$ in $Bi_2O_3$, adjusting the temperature of the solution to a temperature of about 5°C above the saturation temperature of the solution, maintaining the solution at said temperature while immersing polycrystalline $TiO_2$ into said solution until the solution contains a saturating amount of $TiO_2$, removing the undissolved polycrystalline $TiO_2$ from the solution, immersing a $Bi_4Ti_3O_{12}$ seed crystal into said solution maintained at said temperature and then slowly cooling said solution thereby to cause growth of a single crystal of $Bi_4Ti_3O_{12}$.

2. The method of claim 1 wherein a solution of $TiO_2$ in $Bi_2O_3$ and $B_2O_3$ is prepared.

3. A method as claimed in claim 2, wherein the solution consists of a solution of $TiO_2$ in a mixture of $Bi_2O_3$ and $B_2O_3$, which solution consists of 12 mole % $TiO_2$, from 78 to 44 mole % $Bi_2O_3$ and from 10 to 44 mole % $B_2O_3$.

4. A method as claimed in claim 1, wherein the solution consists of a solution of $TiO_2$ in $Bi_2O_3$ containing from 12 to 17 mole % $TiO_2$.

5. A method as claimed in claim 1, wherein the crystal is grown in air.

6. A method as claimed in claim 1 wherein the solution is saturated with $TiO_2$ before the seed crystal is lowered into the solution.

* * * * *